United States Patent
Plante et al.

(10) Patent No.: US 7,661,059 B2
(45) Date of Patent: Feb. 9, 2010

(54) HIGH PERFORMANCE TURBO AND VITERBI CHANNEL DECODING IN DIGITAL SIGNAL PROCESSORS

(75) Inventors: Stephen J. Plante, Stoughton, MA (US); Zvi Greenfield, Ksirsava (IL)

(73) Assignee: Analog Devices, Inc., Norwood, MA (US)

( * ) Notice: Subject to any disclaimer, the term of this patent is extended or adjusted under 35 U.S.C. 154(b) by 553 days.

(21) Appl. No.: 09/923,225

(22) Filed: Aug. 6, 2001

(65) Prior Publication Data

US 2003/0028845 A1 Feb. 6, 2003

(51) Int. Cl.
*H03M 13/03* (2006.01)

(52) U.S. Cl. .................. 714/794; 714/795; 714/796; 375/262; 375/341

(58) Field of Classification Search .......... 714/794, 714/795, 796; 375/262, 341
See application file for complete search history.

(56) References Cited

U.S. PATENT DOCUMENTS

| | | | |
|---|---|---|---|
| 4,823,346 A | | 4/1989 | Kobayashi et al. |
| 5,220,570 A | * | 6/1993 | Lou et al. ............... 714/791 |
| 5,291,499 A | | 3/1994 | Behrens et al. |
| 5,295,142 A | | 3/1994 | Hatakeyama |
| 5,412,669 A | * | 5/1995 | Foland, Jr. ............. 714/796 |
| 5,490,178 A | * | 2/1996 | Blaker et al. ........... 375/341 |
| 5,511,081 A | | 4/1996 | Hagenauer |
| 5,742,621 A | * | 4/1998 | Amon et al. ............ 714/792 |
| 5,933,462 A | | 8/1999 | Viterbi et al. |
| 5,987,490 A | | 11/1999 | Alidina et al. |
| 6,028,899 A | | 2/2000 | Petersen |
| 6,192,084 B1 | | 2/2001 | Miyauchi et al. |
| 6,343,368 B1 | | 1/2002 | Lerzer |
| 6,393,076 B1 | | 5/2002 | Dinc et al. |
| 6,848,074 B2 | * | 1/2005 | Coombs ................... 714/795 |
| 2001/0024474 A1 | | 9/2001 | Rakib et al. |
| 2004/0019843 A1 | | 1/2004 | Kishino |

FOREIGN PATENT DOCUMENTS

| | | |
|---|---|---|
| EP | 1 128 560 A1 | 8/2001 |
| EP | 1 204 211 A1 | 5/2002 |

OTHER PUBLICATIONS

Benedetto et al., "Soft-Output Decoding Algorithms in Iterative Decoding of Turbo Codes", TDA Progress Report 42-124, Feb. 15, 1996, pp. 63-87.

Benedetto et al., "A Soft-Input Soft-Output Maximum A Posteriori (MAP) Module to Decode Parallel and Serial Concatenated Codes", TDA Progress Report 42-127, Nov. 15, 1996, pp. 1-20.

(Continued)

*Primary Examiner*—Joseph D Torres
(74) *Attorney, Agent, or Firm*—Goodwin Procter LLP

(57) ABSTRACT

A digital signal processor performs turbo and Virterbi channel decoding in wireless systems. The computation block of the digital signal processor is provided with an accelerator for executing instructions associated with trellis computations. An ACS instruction performs trellis computations of alpha and beta metrics. Multiple butterfly calculations can be performed in response to a single instruction. A TMAX instruction is used to calculate the log likelihood ratio of the trellis.

9 Claims, 17 Drawing Sheets

OTHER PUBLICATIONS

Divsalar et al., "Hybrid Concatenated Codes and Iterative Decoding", TDA Progress Report 42-130, Aug. 15, 1997, pp. 1-23.

Andrew J. Viterbi, "An Intuitive Justification and a Simplified Implementation of the MAP Decoder for Convolutional Codes", IEEE Journal on Selected Areas in Communications, vol. 16, No. 2, Feb. 1998, pp. 260-264.

Ye Liu et al., "MAP Algorithms for Decoding Linear Block Codes Based on Sectionalized Trellis Diagrams", IEEE, 1998, pp. 562-566.

Ye Liu et al., "MAP Algorithms for Decoding Linear Block Codes Based on Sectionalized Trellis Diagrams", IEEE Transactions on Communications, vol. 48, No. 4, Apr. 2000, pp. 577-587.

Patrick Robertson, Emmanuelle Villebrun and Peter Hoeher, "A Comparison of Optimal and Sub-Optimal MAP Decoding Algorithms Operating in the Log Domain," Institute for Communications Technology, German Aerospace Research Establishment (DLR), Oberpfaffenhofen, Germany, *IEEE* 1995, pp. 1009-1013.

Matthew C. Valenti, "An Introduction to Turbo Codes," Bradley Dept. of Electrical Engineering, Virginia Polytechnic Inst. & S.U., Blacksburg, Virginia, 7 pages.

William E. Ryan, "A Turbo Code Tutorial," New Mexico State University, Las Cruces, NM, 9 pages.

Hui-Ling Lou, "Implementing the Viterbi Algorithm," *IEEE Signal Processing Magazine*, Sep. 1995, pp. 42-52.

Hui-Ling Lou et al., "*An instruction Set For A Programmable Signal Processor Dedicated To Viterbi Detection*", VLSI Technology, Systems, and Applications, 1991. Proceedings of Technical Papers, 1991 International Symposium on Taipei, Taiwan May 22-24, 1991, New York, NY, USA IEEE, US May 22, 1991, pp. 247-251.

Search Report from co-pending European Application No. EP 02 75 6941 dated Apr. 28, 2006.

Supplementary Search Report dated Sep. 11, 2006 from corresponding European Application No. EP 02756941.

Office Action in counterpart Japanese application No. 2003-520088.

* cited by examiner $$Ln[\alpha_k(S)] = MAX\{Ln[\alpha_{k-1}(S')] + Ln[\gamma_k(S',S)],$$
$$Ln[\alpha_{k-1}(S'')] - Ln[\gamma_k(S',S)]\}$$
$$+ Ln[1 + e^{-abs(Ln[\alpha_{k-1}(S')] - Ln[\alpha_{k-1}(S'')])}]$$

FIG. 4

$$Ln[\beta_{k-1}(S)] = MAX\{Ln[\beta_k(S')] + Ln[\gamma_k(S',S)],$$
$$Ln[\beta_k(S'')] - Ln[\gamma_k(S',S)]\}$$
$$+ Ln[1 + e^{-abs(Ln[\beta_k(S')] - Ln[\beta_k(S'')])}]$$

FIG. 5

$$LLR(k) = \underset{S^+}{\text{Max}}\{\ln[\alpha(S_{k-1})] + \ln[\gamma(S',S)] + \ln[\beta(S_k)]\}$$
$$- \underset{S^-}{\text{Max}}\{\ln[\alpha(S_{k-1})] + \ln[\gamma(S',S)] + \ln[\beta(S_k)]\}$$
$$+ \text{Jacobian Correction Factor}$$

*FIG. 6*

```
LOOP:
R7:4    =TR7:4,      TR11:8   = ACS(TR5:4,      TR1:0,  sR24);  q[K22+=4]=xR3:0;           q[J22-=4]=yR3:0;;
R11:8   =TR11:8,     TR15:12  = ACS(TR7:6,      TR3:2,  sR25);  q[K22+=4]=xR7:4;           q[J22-=4]=yR7:4;;

R15:12  =TR15:12,TR3:0        = ACS(TR13:12,TR9:8,      sR26);  q[K22+=4]=xR11:8;          q[J22-=4]=yR11:8;;
R3:0    =TR3:0,      TR7:4    = ACS(TR15:14,TR11:10,sR27);q[K22+=4]=xR15:12;q[J22-=4]=yR15:12;;

R7:4    =TR7:4,      TR11:8   = ACS(TR5:4,      TR1:0,  sR28);  q[K22+=4]=xR3:0;           q[J22-=4]=yR3:0;;
R11:8   =TR11:8,     TR15:12  = ACS(TR7:6,      TR3:2,  sR29);  q[K22+=4]=xR7:4;           q[J22-=4]=yR7:4;;

R15:12  =TR15:12,TR3:0        = ACS(TR13:12,TR9:8,      sR30);  q[K22+=4]=xR11:8;          q[J22-=4]=yR11:8;;
R3:0    =TR3:0,      TR7:4    = ACS(TR15:14,TR11:10,sR31);q[K22+=4]=xR15:12;q[J22-=4]=yR15:12;;

If nLCOE, jump loop;;
```

FIG. 11

//ADD    Alpha + Betas for 0 and 1 State Changes

TR9:8    = TMAX(TR1:0  + R9:8,    TR3:2  + R11:10);;
TR11:10  = TMAX(TR1:0  + R13:12,  TR3:2  + R15:14);;
TR13:12  = TMAX(TR5:4  + R13:12,  TR7:6  + R15:14);;
TR15:14  = TMAX(TR5:4  + R9:8,    TR7:6  + R11:10);;

//ADD    Gamma for 0 and 1 State Changes

TR5:4    = TMAX(TR9:8   + R0:0,  TR13:12 + R1:1);;
TR12:11  = TMAX(TR11:10 − R0:0,  TR15:14 − R1:1);;

R0       = TMAX(TR5, TR4);;
R1       = TMAX(TR12,TR11);;

HIGH PERFORMANCE TURBO AND VITERBI CHANNEL DECODING IN DIGITAL SIGNAL PROCESSORS

FIELD OF THE INVENTION

This invention relates to digital signal processors for wireless mobile and base station applications and, more particularly, to the use of digital signal processors for turbo and Viterbi channel decoding in wireless base stations.

BACKGROUND OF THE INVENTION

Second and third generation wireless systems employ channel coding and decoding algorithms and spread spectrum techniques to enhance transmission reliability. In third generation wireless systems, a convolutional coding scheme is specified for voice transmission, and a parallel concatenated convolutional coding (PCCC) scheme is specified for data transmission. The convolutional encoded data is decoded using the Viterbi decoding algorithm, and the PCCC encoded data is decoded using a turbo decoding algorithm. The turbo and Viterbi decoding schemes are trellis-based algorithms.

Viterbi and turbo decoder algorithms are extremely computational intensive. The forward error correction, or channel decoding, block in a wireless base station can approach 80% of the symbol rate processing in the software radio. Proposed approaches to executing these algorithms within the allotted time constraints have included the use of ASICs and the use of a hardware block having the most basic components in a digital signal processor.

A digital signal processor, rather than an ASIC, is a desirable solution because of its software programmability. However, no currently available digital signal processor can handle the complete chip and symbol rate processing requirement of the software radio. System designers are therefore researching solutions which use a digital signal processor and an ASIC or an ASIC alone to handle the symbol rate processing. At a minimum, the ASIC would execute the forward error correction.

A digital signal processor having dual computation units, wide memory buses and the ability to handle multiple tasks in parallel is disclosed in U.S. Pat. No. 5,896,543 issued Apr. 20, 1999 to Garde. The disclosed digital signal processor delivers extremely high performance, but as currently configured cannot efficiently execute the forward error correction of a wireless base station within the allotted time constraints.

Accordingly, there is a need for improved implementations of the turbo and Viterbi channel decoding algorithms used in wireless systems.

SUMMARY OF THE INVENTION

According to a first aspect of the invention, a method is provided for calculating metrics of a trellis function in a digital signal processor. The metrics of the trellis function are calculated for selected trellis states in response to trellis state metrics for a time $t_0$ and transition metrics from time $t_0$ to time $t_1$ specified by a trellis instruction. The calculations for each selected trellis state include adding a transition metric to a first state metric for time $t_0$ to provide a first value, subtracting the transition metric from a second state metric for time $t_0$ to provide a second value, comparing the corresponding first and second values, and selecting the maximum of the corresponding first and second values to provide trellis state metrics for time $t_1$.

The method may further comprise the step of, for each selected trellis state, adding to the maximum value a correction factor that is a function of the corresponding first and second values. The step of adding a correction factor may comprise accessing a lookup table containing correction factors.

In one embodiment, the trellis instruction implements a forward trellis function for calculating $\alpha$ trellis state metrics. In another embodiment, the trellis instruction implements a reverse trellis function for calculating $\beta$ trellis state metrics. In yet another embodiment, the trellis instruction simultaneously implements a forward trellis function for calculating $\alpha$ trellis state metrics and a reverse trellis function for calculating $\beta$ trellis state metrics, using a single instruction, multiple data approach.

According to another aspect of the invention, a method is provided for calculating metrics of a trellis function in a digital signal processor. In response to $\alpha$ metrics for a time $t_0$ and transition metrics from time $t_0$ to time $t_1$ specified by a trellis instruction, an $\alpha$ metric is calculated for selected trellis states for time $t_1$. In response to $\beta$ metrics for a time $t_2$ and transition metrics from time $t_2$ to $t_1$ specified by the trellis instruction, a $\beta$ metric is calculated for the selected trellis states for time $t_1$.

The step of calculating an $\alpha$ metric for the selected trellis states may comprise the steps of, for each selected trellis state, adding a transition metric to a first $\alpha$ metric for time $t_0$ to provide a first value and subtracting the transition metric from a second $\alpha$ metric for time $t_0$ to provide a second value, for each selected trellis state, comparing the corresponding first and second values, and selecting the maximum of the corresponding first and second values for each selected trellis state to provide $\alpha$ metrics for time $t_1$.

The step of calculating a $\beta$ metric for the selected trellis states may comprise the steps of, for each selected trellis state, adding a transition metric to a first $\beta$ metric for time $t_2$ to provide a first value and subtracting the transition metric from a second $\beta$ metric for time $t_2$ to provide a second value, for each selected trellis state, comparing the corresponding first and second values, and selecting the maximum of the corresponding first and second values for each selected trellis state to provide $\beta$ metrics for time $t_1$.

The steps of calculating an $\alpha$ metric and calculating a $\beta$ metric may each further comprise the step of, for each selected trellis state, adding to the maximum value a correction factor that is a function of the corresponding first and second values. The steps of calculating an $\alpha$ metric and calculating a $\beta$ metric may be performed simultaneously.

According to a further aspect of the invention, a method is provided for calculating a log MAP function in a digital signal processor. A log MAP instruction specifies locations of first, second, third and fourth parameters. The sum or difference of the first and second parameters is calculated to provide a first value, and the sum or difference of the third and fourth parameters is calculated to provide a second value. The maximum of the first and second values is selected. Then a correction factor that is a function of the first and second values is added to the maximum value to provide log MAP result. The step of adding a correction factor may comprise accessing a lookup table containing correction factors.

A digital signal processor may comprise a memory for storing instructions and operands for digital signal computations, a program sequencer for generating instruction addresses for fetching selected ones of the instructions from the memory, and a computation block comprising a register file for temporary storage of operands and results, and an accelerator for performing the operations described above, either separately or in any combination. In a preferred embodiment, the digital signal processor comprises two or more computation blocks for performing multiple operations in parallel.

According to a further aspect of the invention, an accelerator is provided for use in the digital signal processor computation block. The accelerator comprises a first carry save adder for receiving inputs to the accelerator, a first full adder for combining sum and carry outputs of the first carry save adder, a lookup table for generating a correction factor in response to the output of the first full adder, a multiplexer for selecting one or more of the inputs to the accelerator in response to the sign of the output of the first full adder, a second carry save adder for adding one or more outputs of the multiplexer and the output of the lookup table, and a second full adder for combining sum and carry outputs of the second carry save adder.

The first carry save adder and the first full adder may comprise a first pipeline stage; the lookup table, the multiplexer and the second carry save adder may comprise a second pipeline stage; and the second full adder may comprise a third pipeline stage. In a preferred embodiment, the accelerator further comprises a data selector for supplying the sum and carry outputs of the second carry sum adder to the inputs of the first carry sum adder.

BRIEF DESCRIPTION OF THE DRAWINGS

For a better understanding of the present invention, reference is made to the accompanying drawings, which are incorporated herein by reference and in which:

FIG. 4 illustrates an equation for calculating α metrics of a trellis;

FIG. 5 illustrates an equation for calculating β metrics of a trellis;

FIG. 6 illustrates an equation for calculating log likelihood ratio of a trellis;

FIG. 11 illustrates software code for performing turbo channel decoding in accordance with an aspect of the invention;

FIG. 16 illustrates software code for calculating the log likelihood ratio of a trellis using the log MAP instruction;

DETAILED DESCRIPTION

Figure 1:
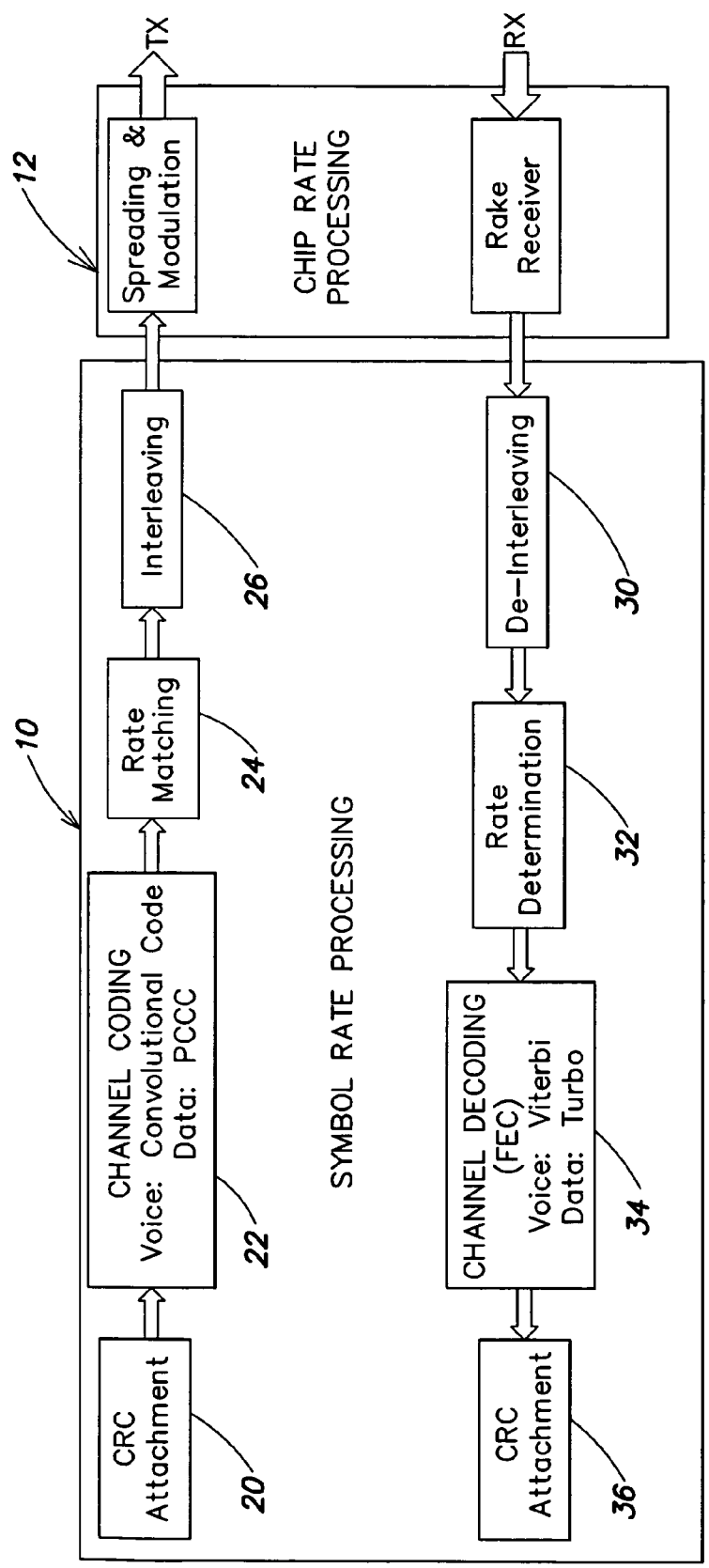
FIG. 1 is a block diagram of a wireless base station signal chain.

A block diagram of an example of a wireless base station signal chain is shown in FIG. 1. The signal chain includes symbol rate processing 10 and chip rate processing 12. It is desirable to incorporate the symbol rate processing 10 into a digital signal processor. On the transmit side, the symbol rate processing 10 includes a CRC attachment block 20, a channel coding block 22, a rate matching block 24 and an interleaving block 26. On the receive side, the symbol rate processing 10 includes a de-interleaving block 30, a rate determination block 32, a channel decoding block 34 and a CRC attachment block 36. As noted above, forward error correction (FEC), or channel decoding, can approach 80% of the symbol rate processing.

Aspects of the present invention are directed to implementations of the channel decoding block 34 in a digital signal processor. The channel coding block 22 may utilize a convolutional code for voice or low data rate transmission and a PCCC scheme for high data rate transmission. The channel decoding block 34 may utilize a Viterbi decoding algorithm for voice and a turbo decoding algorithm for data.

Figure 2:
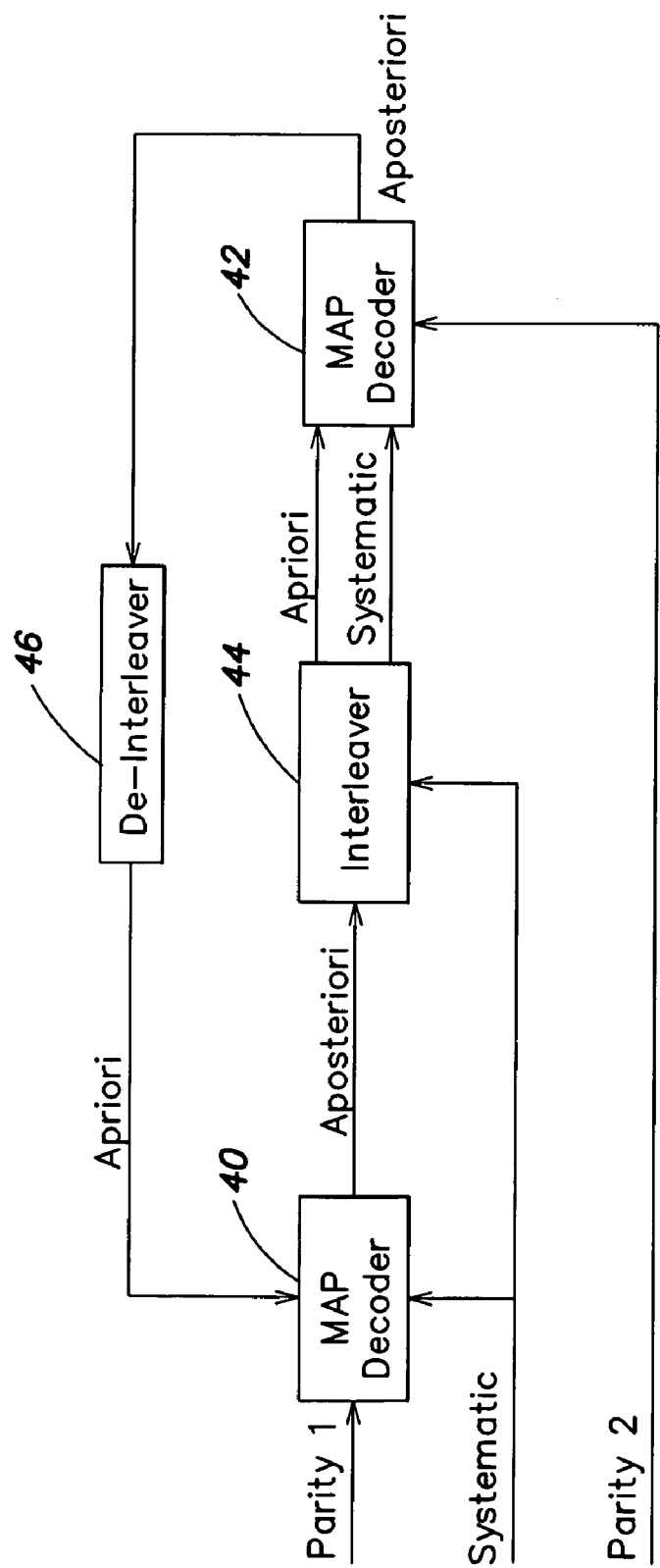
FIG. 2 is a block diagram of a turbo decoder algorithm.

A simplified block diagram of an example of a turbo decoder is shown in FIG. 2. The turbo decoder includes MAP (maximum a posteriori) decoders 40 and 42, interleaver 44 and de-interleaver 46. Turbo codes are described, for example, by M. Valenti in "An Introduction to Turbo Codes", Dept. of Elect. Eng., Virginia Polytechnic Inst. and by W. Ryan in "A Turbo Code Tutorial", New Mexico State University. A single MAP decoder may be used to implement the Viterbi decoder. The Viterbi algorithm is described by H. Lou in "Implementing the Viterbi Algorithm", IEEE Signal Processing Magazine, September 1995, pp. 42-52.

Figure 3:
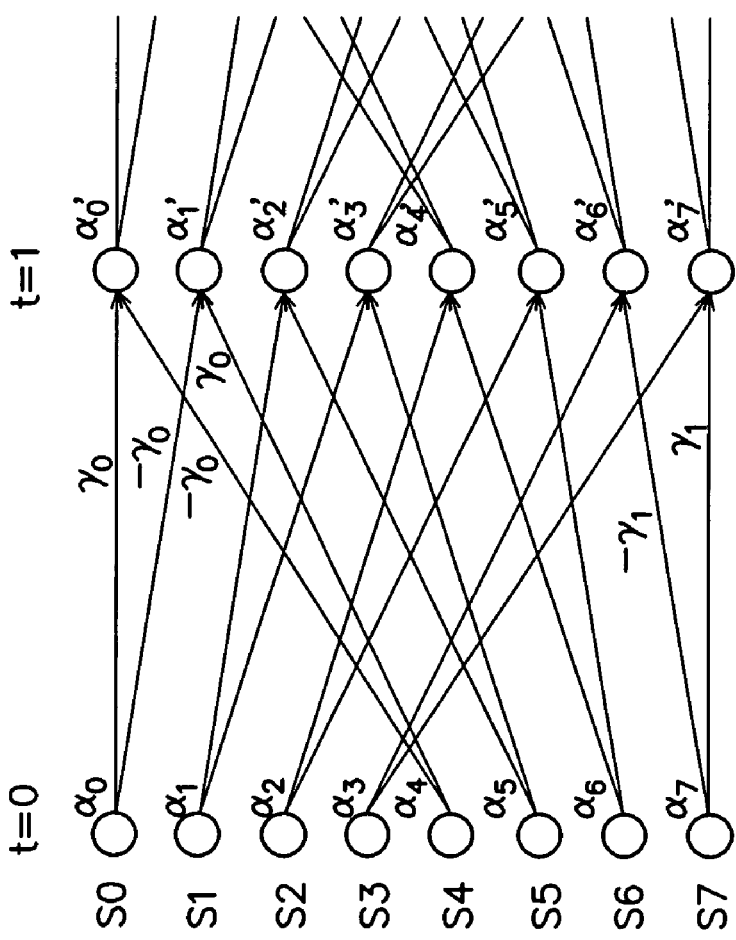
FIG. 3 is a schematic representation of an eight state trellis.

The turbo and Viterbi channel decoding algorithms are trellis-based algorithms performed on blocks of received data. An example of an eight state trellis typically used in wireless systems is shown in FIG. 3. The trellis includes states S0, S1, S2 ... S7 associated with each of a plurality of time points t=0, t=1 ... t=N. Associated with each trellis state is an alpha ($\alpha$) metric, related to the probability of being at this state from the initial point in the calculation. Also associated with each trellis state is a beta ($\beta$) metric, related to the probability of ending at the correct state from this state. Thus, eight $\alpha$ metrics and eight $\beta$ metrics are associated with each time point in the trellis. The trellis is also characterized by gamma ($\gamma$) transition metrics, related to the probability of going from one state at a first time point to another state at the next time point. Thus, for example, in the trellis of FIG. 3 alpha metrics $\alpha_0$ and $\alpha_1$ are associated with states S0 and S1, respectively at time t=0 and alpha metrics $\alpha_0'$ and $\alpha_1'$ are associated with states S0 and S1, respectively, at time t=1. Transition metric $\gamma$ is associated with the transition from state S0 at time t=0 to state S0 at time t=1, and transition metric $-\gamma$ is associated with the transition from state S0 at time t=0 to state S1 time t=1. In general, alpha metrics $\alpha_0, \alpha_1, \ldots \alpha_7$ are associated with trellis states S0, S1, ... S7, respectively. Similarly, beta metrics $\beta_0, \beta_1, \ldots \beta_7$ are associated with trellis states S0, S1, ... S7, respectively. In addition, transition metric $\gamma_0$ is associated with transitions from states S0, S1, S2 and S3, and transition metric $\gamma_1$ is associated with transitions from states S4, S5, S6 and S7.

An equation for calculating alpha metrics for each trellis state is shown in FIG. 4, where k represents the trellis state and s represents the time point. The last term in the equation of FIG. 4 is a correction factor that is a function of the alpha metrics. An equation for calculating the beta metrics for each trellis state is shown in FIG. 5. The last term in the equation of FIG. 5 is a correction factor that is a function of the beta metrics.

An application of the equation of FIG. 4 to the trellis of FIG. 3 is now described. The alpha metrics $\alpha_0'$ and $\alpha_1'$ for states S0 and S1, respectively, at time t=1 may be calculated as follows:

$$\alpha_0' = MAX[\alpha_0 + \gamma_0, \alpha_4 - \gamma_0] + C_0' \quad (1)$$

$$\alpha_1' = MAX[\alpha_0 - \gamma_0, \alpha_4 + \gamma_0] + C_1' \quad (2)$$

where $C_0'$ and $C_1'$ are correction factors that depend on the values of $\alpha_0$ and $\alpha_4$ as shown in FIG. 4.

Thus, the alpha metrics for each state are calculated by algebraically summing, for each of two previous states from which a transition to the current state is possible, the alpha metric of the previous state and the transition metric for a transition from the previous state to the current state to provide two values. Then, the maximum of the two valves is selected. The correction factor is added to the selected maximum value. As described below, the correction factor may be obtained from a lookup table. The alpha metrics may be calculated for each state in the trellis in a similar manner. Likewise, the equation of FIG. 5 may be applied in a similar manner to calculate beta metrics for each state in the trellis. The calculation of the metrics of two states, each based on the metrics of two previous states, is commonly referred to as a "butterfly" calculation.

The log likelihood ratio is also calculated in connection with channel decoding. The log likelihood ratio is the log of a ratio of the profitability of state 1 to the probability of state 0. An equation for calculating log likelihood ratio is shown in FIG. 6. Calculation of the log likelihood ratio is discussed in detail below.

Figure 7:
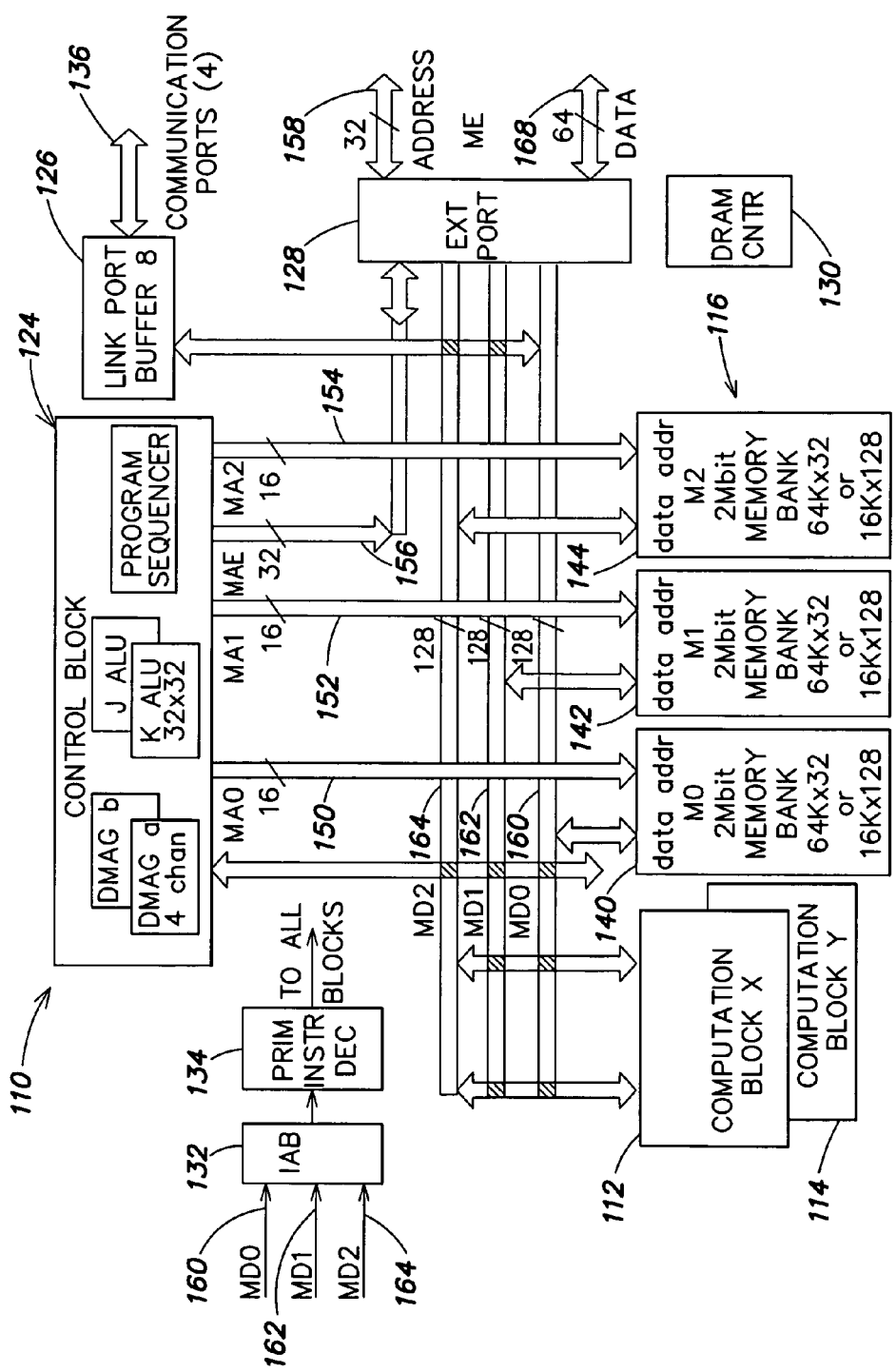
FIG. 7 is a block diagram of a digital signal processor suitable for implementing channel decoders in accordance with an aspect of the invention.

A block diagram of an example of a digital signal processor (DSP) 110 suitable for implementing features of the present invention is shown in FIG. 7. The principal components of DSP 110 are computation blocks 112 and 114, a memory 116, a control block 124, link port buffers 126, an external port 128, a DRAM controller 130, an instruction alignment buffer (IAB) 132 and a primary instruction decoder 134. The computation blocks 112 and 114, the instruction alignment buffer 132, the primary instruction decoder 134 and the control block 124 constitute a core processor which performs the main computation and data processing functions of the DSP 110. The external port 128 controls external communications via an external address bus 158 and an external data bus 168. The link port buffers 126 control external communication via communication ports 136. The DSP is preferably configured as a single monolithic integrated circuit.

The memory 116 may include three independent, large capacity memory banks 140, 142 and 144. In a preferred embodiment, each of the memory banks 140, 142 and 144 has a capacity of 64 K words of 32 bits each. As discussed below, each of the memory banks 140, 142 and 144 preferably has a 128-bit data bus. Up to four consecutive aligned data words of 32 bits each can be transferred to or from each memory bank in a single clock cycle.

The elements of the DSP 110 are interconnected by buses for efficient, high speed operation. Each of the buses includes multiple lines for parallel transfer of binary information. A first address bus 150 (MA0) interconnects memory bank 140 (M0) and control block 124. A second address bus 152 (MA1) interconnects memory bank 142 (M1) and control block 124. A third address bus 154 (MA2) interconnects memory bank 144 (M2) and control block 124. Each of the address buses 150, 152 and 154 is preferably 16 bits wide. An external address bus 156 (MAE) interconnects external port 128 and control block 124. The external address bus 156 is interconnected through external port 128 to external address bus 158. Each of the external address buses 156 and 158 is preferably 32 bits wide. A first data bus 160 (MD0) interconnects memory bank 140, computation blocks 112 and 114, control block 124, link port buffers 126, IAB 132 and external port 128. A second data bus 162 (MD1) interconnects memory bank 142, computation blocks 112 and 114, control block 124, link port buffers 126, IAB 132 and external port 128. A third data bus 164 (MD2) interconnects memory bank 144, computation blocks 112 and 114, control block 124, link port buffers 126, IAB 132 and external port 128. The data buses 160, 162 and 164 are connected through external port 128 to external data bus 168. Each of the data buses 160, 162 and 164 is preferably 128 bits wide, and external data bus 168 is preferably 64 bits wide.

The first address bus 150 and the first data bus 160 comprise a bus for transfer of data to and from memory bank 140. The second address bus 152 and the second data bus 162 comprise a second bus for transfer of data to and from memory bank 142. The third address bus 154 and the third data bus 164 comprise a third bus for transfer of data to and from memory bank 144. Since each of the memory banks 140, 142 and 144 has a separate bus, the memory banks 140, 142 and 144 may be accessed simultaneously. As used herein, "data" refers to binary words, which may represent either instructions or operands that are associated with the operation of the DSP 110.

In a typical operating mode, program instructions are stored in one of the memory banks, and operands are stored in the other two memory banks. Thus, at least one instruction and two operands can be provided to the computation blocks 112 and 114 in a single clock cycle. Each of the memory banks 140, 142 and 144 may be configured to permit reading and writing of multiple data words in a single clock cycle. The simultaneous transfer of multiple data words from each memory bank in a single clock cycle is accomplished without requiring an instruction cache or a data cache.

As indicated above, each of the memory banks 140, 142 and 144 preferably has a capacity of 64 K words of 32 bits each. Each memory bank may be connected to a data bus that is 128 bits wide. In an alternative embodiment, each data bus may be 64 bits wide, and 64 bits are transferred on each of clock phase 1 and clock phase 2, thus providing an effective bus width of 128 bits. Multiple data words can be accessed in each memory bank in a single clock cycle. Specifically, data can be accessed as single, dual or quad words of 32 bits each.

Using quad word transfers, four instructions and eight operands, each of 32 bits, can be supplied to the computation blocks 112 and 114 in a single clock cycle. The number of data words transferred and the computation block or blocks to which the data words are transferred are selected by control bits in the instruction. The single, dual or quad data words can be transferred to computation block 112, to computation block 114, or to both. Dual and quad data word accesses improve the performance of the DSP 110 in many applications by allowing several operands to be transferred to the computation blocks 112 and 114 in a single clock cycle. The ability to access multiple instructions in each clock cycle allows multiple operations to be executed in each clock cycle, thereby improving performance.

Figure 8:
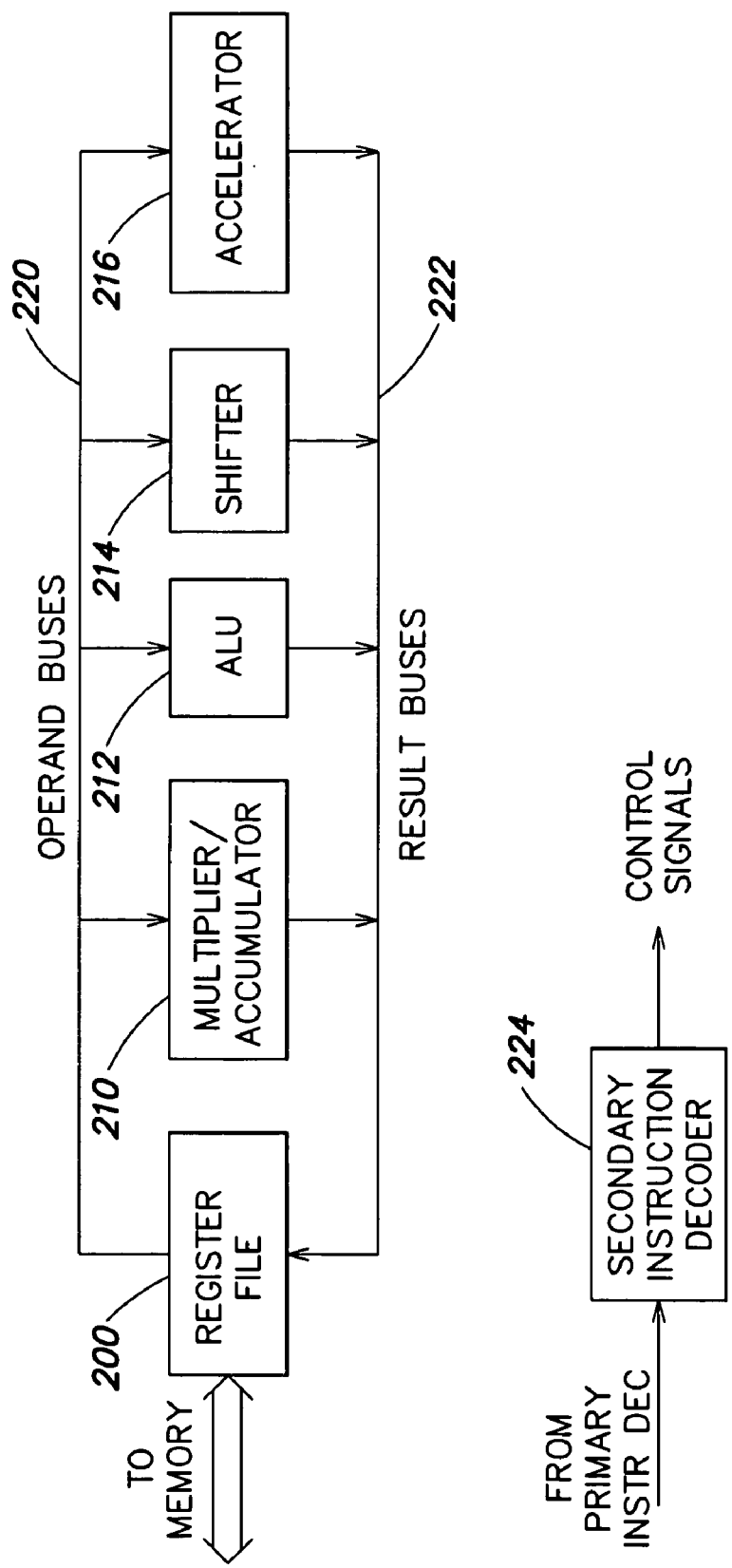
FIG. 8 is a block diagram of an embodiment of each computation block shown in the digital signal processor of FIG. 7.

A block diagram of an embodiment of each of the computation blocks 112 and 114 is shown in FIG. 8. A multiple port register file 200 provides temporary storage for operands and results. In a preferred embodiment, the register file 200 has a capacity of 32 words of 32 bits each, organized as eight rows of 128 bits each. The register file 200 is connected through a multiplexer and latch (not shown) to each of the data buses 160, 162 and 164 (FIG. 7). When operands are fetched from memory 116, two of the three data buses are selected, and the operands on the selected buses are supplied to the register file 200.

The computation block shown in FIG. 8 includes a multiplier/accumulator 210, an arithmetic logic unit (ALU) 212, a shifter 214 and an accelerator 216. The multiplier/accumulator 220, the ALU 212, the shifter 214 and the accelerator 216 are capable of simultaneous execution of instructions to the extent that sufficient instructions and operands can be supplied to the computation blocks. Operands are supplied from the register file 200 to multiplier/accumulator 210, ALU 210, shifter 214 and accelerator 216 on operand buses 220. Results from the multiplier/accumulator 210, the ALU 212, the shifter 214 and the accelerator 216 are returned to register file 200 on result buses 222. The components of the computation block are controlled by signals from a secondary instruction decoder 224, in response to a decoded instruction. The computation block preferably has a pipelined architecture for improved performance.

Each of the computation blocks 112 and 114 in the DSP includes the accelerator 216 for enhanced performance in wireless base stations. The accelerator includes registers for temporary storage of data and control values and accelerator circuitry for executing specified instructions. The structure and operation of the accelerator 216 are described in detail below.

It will be understood that the DSP 110 is described by way of example only. Features of the present invention may be implemented in different digital signal processor architectures.

Figure 9:
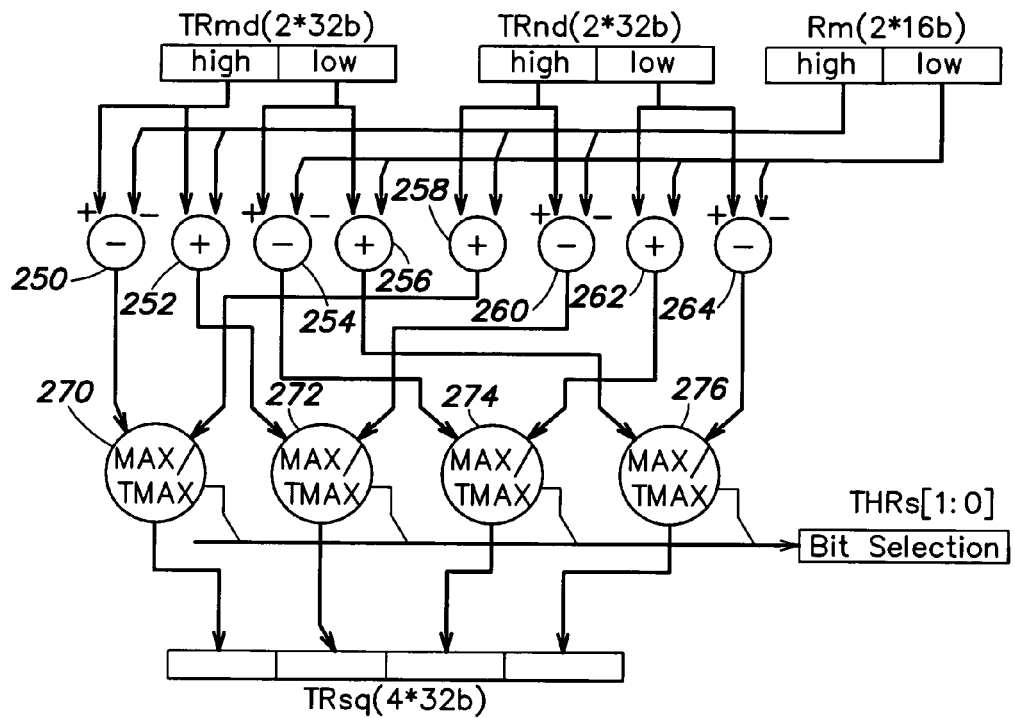
FIG. 9 is a data flow diagram that illustrates a first embodiment of operations that may be performed in response to a trellis instruction.

A data flow diagram of the operations performed by each accelerator in response to an ACS, or trellis, instruction is shown in FIG. 9. A high data word, such as an alpha metric or a beta metric, in a register pair TRmd is supplied to a subtracting unit 250 and to a summing unit 252. A low data word in register pair TRmd is supplied to a subtracting unit 254 and to a summing unit 256. A high data word in a register pair TRnd is supplied to a summing unit 258 and to a subtracting unit 260. A low data word in register pair TRnd is supplied to a summing unit 262 and to a subtracting unit 264. A high data word in a register Rm, which may be a gamma transition metric, is supplied to subtracting unit 250, summing unit 252, summing unit 258 and subtracting unit 260. A low data word in register Rm is supplied to subtracting unit 254, summing unit 256, summing unit 262 and subtracting unit 264. The outputs of subtracting unit 250 and summing unit 258 are supplied to a MAX/TMAX unit 270. The outputs of summing unit 252 and subtracting unit 260 are supplied to a MAX/TMAX unit 272. The outputs of subtracting unit 254 and summing unit 262 are supplied to a MAX/TMAX unit 274. The outputs of summing unit 256 and subtracting unit 264 are supplied to a MAX/TMAX unit 276. The outputs of MAX/TMAX units 270, 272, 274 and 276 are stored in a quad register TRsq.

The MAX/TMAX units 270, 272, 274 and 276 each perform one of two functions that may be specified in the trellis instruction. In the MAX function, the maximum of the two inputs is selected and is stored in quad register TRsq. In the TMAX function, the maximum of the two inputs is selected and a correction value is added to the selected maximum value. The sum is stored in quad register TRsq. The correction factor is a function of the two inputs to the MAX/TMAX unit. As described below, the correction factor can be determined from a lookup table. The MAX/TMAX units 270, 272, 274 and 276 each provide an output bit to a bit selection register pair THRs. Each output bit indicates the input that was selected as the maximum value.

In the embodiment of FIG. 9, the data values in register pairs TRmd and TRnd, such as alpha metrics or beta metrics, are 32-bit values, and the data values in register Rm, such as transition metrics, are 16-bit values. The output values stored in quad register TRsq are 32 bit values. In the embodiment of FIG. 9, each accelerator performs two 32-bit butterfly calculations of a trellis in response to a single trellis instruction.

Figure 10:
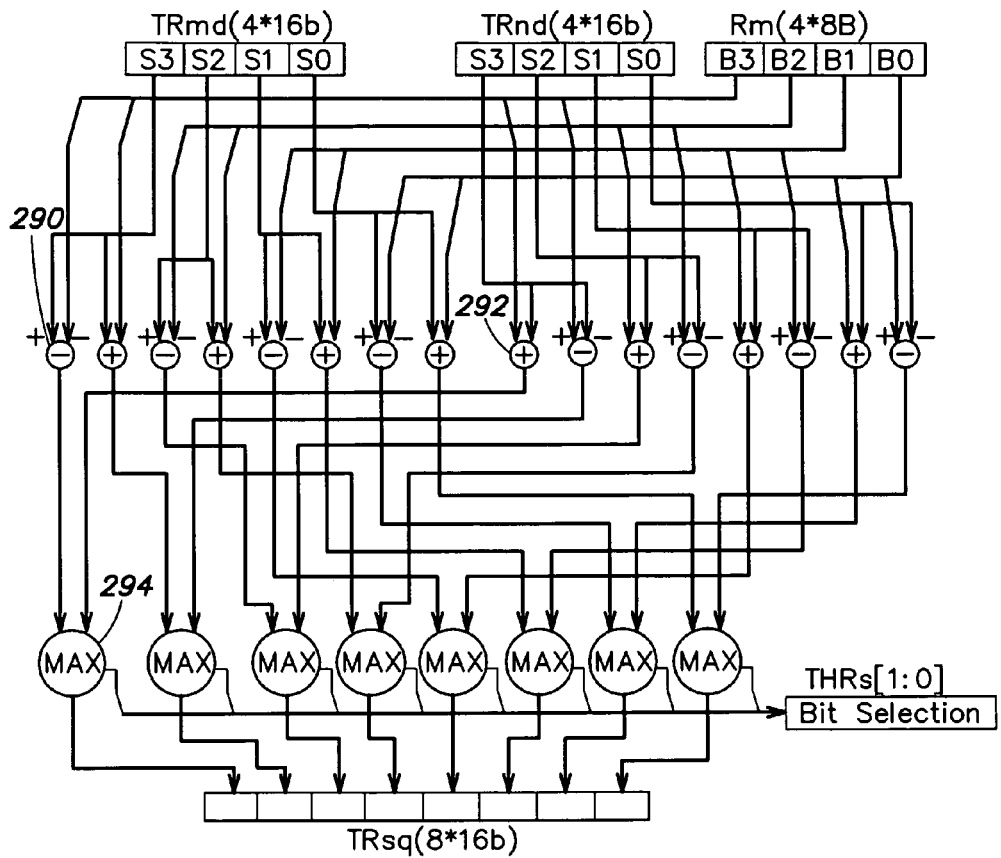
FIG. 10 is a data flow diagram that illustrates a second embodiment of operations that may be performed in response to a trellis instruction.

In another embodiment of the trellis instruction, shown in FIG. 10, each accelerator performs four 16-bit butterfly calculations in response to a single trellis instruction. In FIG. 10, register pair TRmd and register pair TRnd each contain four 16-bit data values, such as alpha metrics or beta metrics, and register Rm contains four 8-bit data values, such as transition metrics. The data values are supplied to eight subtracting units, 290, etc. and eight summing units 292, etc., and the outputs of the subtracting units and the summing units are supplied to eight MAX units 294, etc. For example, subtracting unit 290 receives data word S3 from register pair TRmd and data word B3 from register Rm. Summing unit 292 receives data word S3 from register pair TRnd and data word B3 from register Rm. The outputs of subtracting unit 290 and summing unit 292 are supplied to MAX unit 294. The MAX unit 294 selects the maximum of the two inputs and stores the selected maximum value in quad register TRsq. The TMAX option is not included in the embodiment of FIG. 10. The MAX units also supply an output bit to register pair THRs to indicate which input was selected. The remaining units in FIG. 10 operate in the same manner to provide four 16-bit butterfly calculations of a trellis in response to a single trellis instruction.

An example of software code for calculating alpha metrics and beta metrics of a trellis function is shown in FIG. 11. The code is implemented using ACS instructions which perform the operations shown in FIG. 9 and described above. In FIG. 11, each ACS instruction specifies the calculations for two trellis butterfly calculations as shown in FIG. 9. The ACS instruction is executed in computation blocks 112 and 114 (FIG. 7) to provide a total of four butterfly calculations. The instructions are grouped in pairs in FIG. 11, with a first instruction calculating alpha metrics and beta metrics for the first four states of the trellis at a given time point and the second instruction calculating alpha metrics and beta metrics for the last four states of the trellis at the given time point. Thus, the calculations for a turbo channel decoder are performed using two instructions per time point in the trellis. The software code in FIG. 11 illustrates a loop containing the operations for calculating metrics for four time points in the trellis. Operations in each instruction line of FIG. 11 are performed simultaneously by the digital signal processor. In other implementations, the first instruction may calculate alpha metrics for the eight states of the trellis at a given time point, and a second instruction may calculate beta metrics for the eight states of the trellis at the given time point.

In the first instruction line of FIG. 11, TR11:8 corresponds to quad register TRsq in FIG. 9. Also in the first instruction line, TR5:4 and TR1:0 correspond to register pair TRmd and register pair TRnd, respectively. The register sR24 corresponds to register Rm in FIG. 9. It will be understood that the instruction may be executed in both computation units with different data values to perform four butterfly calculations in response to a single ACS, or trellis, instruction. The first instruction line in FIG. 11 further specifies that the data values in registers TR7:4 are moved to registers R7:4 in register file 200 (FIG. 8). In addition, the first instruction line specifies memory load operations to registers xR3:0 in computation unit 112 and registers yR3:0 in computation unit 114.

Figure 12:
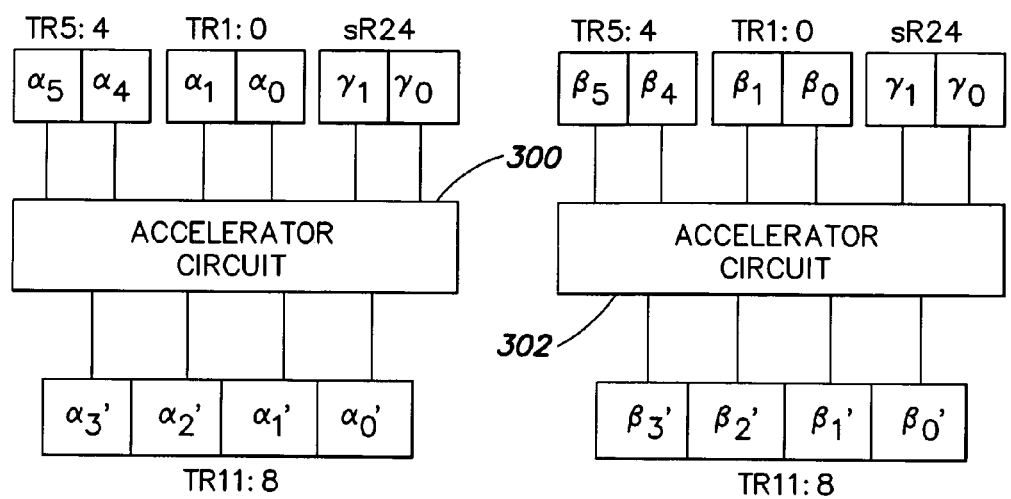
FIG. 12 is a schematic block diagram that illustrates calculation of alpha metrics and beta metrics for trellis states S0-S3 in a first digital signal processor cycle.
Figure 13:
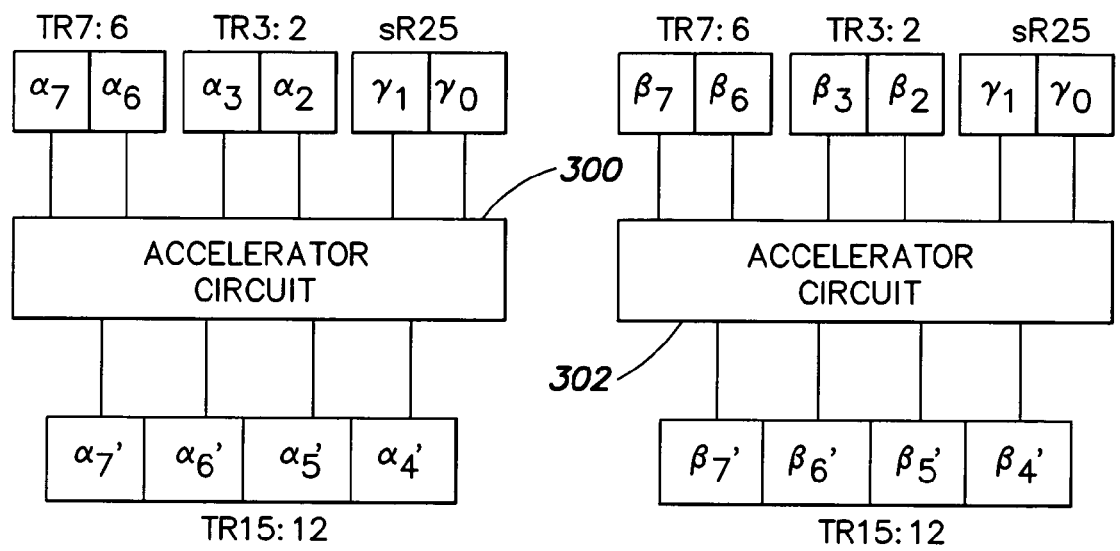
FIG. 13 is a schematic block diagram that illustrates calculation of alpha metrics and beta metrics for trellis states S4-S7 in a second digital signal processor cycle.

The execution of the first two instruction lines in the software code of FIG. 11 is described with reference to FIGS. 12 and 13. FIG. 12 illustrates calculation of alpha metrics and beta metrics for trellis states S0-S3 in a first cycle of DSP 110, and FIG. 13 illustrates calculation of alpha metrics and beta metrics for trellis states S4-S7 in a second cycle of DSP 110. As shown in FIG. 12, an accelerator circuit 300 in computation block 112 receives data values from a register pair TR5:4, a register pair TR1:0 and a register sR24 and supplies output data values to a quad register TR11:8. Similarly, an accelerator circuit 302 in computation block 114 receives data values from a register pair TR5:4, a register pair TR1:0 and a register sR24 and supplies output data values to a quad register TR11:8. The registers shown in FIG. 12 correspond to the registers specified by the ACS instruction in the first instruction line of FIG. 11. In a preferred embodiment, the TR registers are located in each accelerator 216 (FIG. 8) and the R registers are located in each register file 200. Register pair TR5:4 in FIG. 12 corresponds to register pair TRmd in FIG. 9, and register pair TR1:0 corresponds to register pair TRnd. Similarly, register sR24 in FIG. 12 corresponds to register Rm in FIG. 9, and quad register TR11:8 corresponds to quad register TRsq in FIG. 9. FIG. 12 illustrates SIMD operation, where a single instruction is executed by two or more execution units, such as accelerator circuits 300 and 302, with different data.

As shown in FIG. 12, the first instruction line of FIG. 11 calculates the alpha metrics and the beta metrics for trellis states S0-S3. In particular, accelerator circuit 300 calculates alpha metrics $\alpha_0'$, $\alpha_1'$, $\alpha_2'$ and $\alpha_3'$ based on the values of $\alpha_5$ and $\alpha_4$ contained in register pair TR5:4, the values of $\alpha_1$ and $\alpha_0$ contained in register pair TR1:0 and the values of $\gamma_1$ and $\gamma_0$ contained in register sR24. Similarly, accelerator circuit 302 calculates beta metrics $\beta_0'$, $\beta_1'$, $\beta_2'$, and $\beta_3'$ based on the values of $\beta_5$ and $\beta_4$ contained in register pair 5:4, the values of $\beta_1$ and $\beta_0$ contained in register pair TR1:0 and the values of $\gamma_1$ and $\gamma_0$ contained in register sR24.

Referring now to FIG. 13, the calculation of the alpha metrics and the beta metrics for trellis states S4-S8 during a second digital signal processor cycle is shown. The operations of FIG. 13 correspond to the second instruction line in FIG. 11. Accelerator circuit 300 calculates alpha metrics $\alpha_4'$, $\alpha_5'$, $\alpha_6'$ and $\alpha_7'$ based on the values of $\alpha_7$ and $\alpha_6$ contained in register pair TR7:6, the values of $\alpha_3$ and $\alpha_2$ contained in register pair TR3:2 and the values of $\gamma_1$ and $\gamma_0$ contained in register sR25. Similarly, accelerator circuit 302 calculates beta metrics $\beta_4'$, $\beta_5'$, $\beta_6'$ and $\beta_7'$ based on the values of $\beta_7$ and $\beta_6$ contained in register pair TR7:6, the values of $\beta_3$ and $\beta_2$ contained in register pair TR3:2 and the values of $\gamma_1$ and $\gamma_0$ contained in register sR25.

The accelerator circuits 300 and 302 perform four butterfly calculations in a first DSP cycle as shown in FIG. 12 and four butterfly calculations in a second DSP cycle as shown in FIG. 13, thereby calculating the complete alpha metrics and beta metrics for the eight trellis states in two cycles of the digital signal processor. Thus, the software code of FIG. 11 calculates the alpha metrics and the beta metrics for four time points of the trellis. In the embodiment of FIGS. 11-13, accelerator registers TR0:7 in computation block 112 contain alpha metrics for trellis states S0-S7 at a first time point and accelerator registers TR8:15 contain the alpha metrics for trellis states S0-S7 at a second time point. Similarly, accelerator registers TR0:7 in computation block 114 contain beta metrics for trellis states S0-S7 at a first time point and accelerator registers TR7:15 contain beta metric for trellis states S0-S7 at a second time point.

Figure 14:
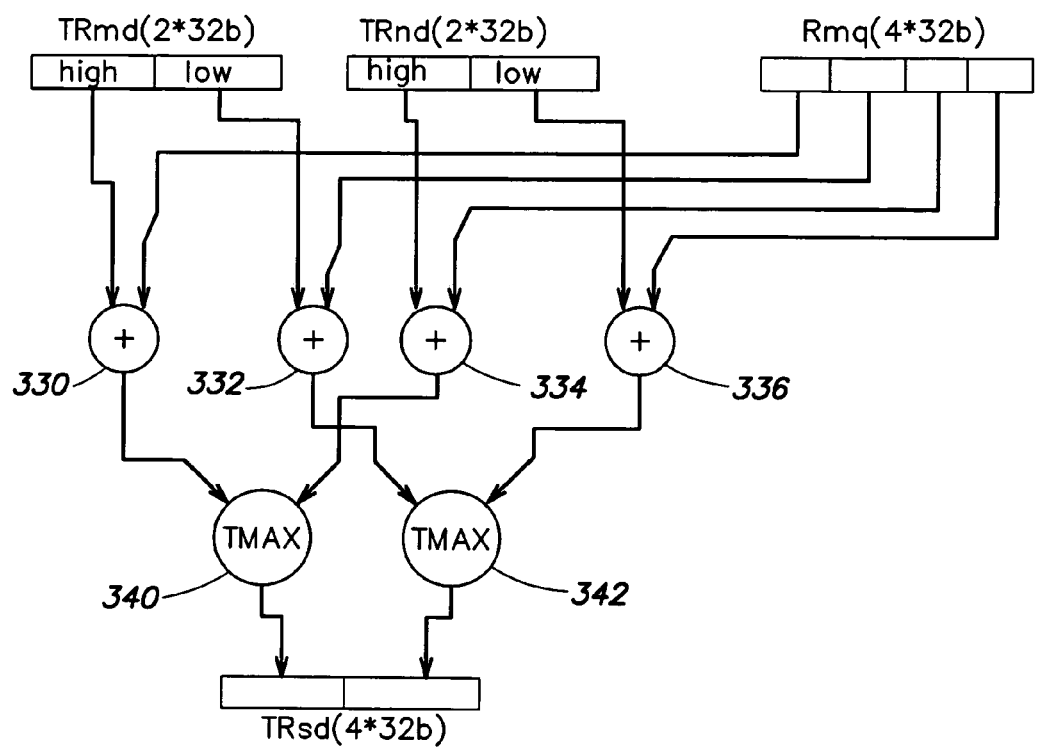
FIG. 14 is a data flow diagram that illustrates operations performed in response to a first log MAP instruction.

A data flow diagram that illustrates operations performed in response to a first type of log MAP instruction is shown in FIG. 14. Data values are held in register pairs TRmd and TRnd and quad register Rmq. Each data value is 32 bits in the example of FIG. 14. The data values may represent alpha metrics, beta metrics or transition metrics. A summing unit 330 receives the high data word from register pair TRmd and the first data word from quad register Rmq. A summing unit 332 receives the low data word from register pair TRmd and the second data word from quad register Rmq. A summing unit 334 receives the high data word from register pair TRnd and the third data word from quad register Rmq. A summing unit 336 receives the low data word from register pair TRnd and the fourth data word from quad register Rmq. A TMAX unit 340 receives the outputs of summing units 330 and 334. A TMAX unit 342 receives the outputs of summing units 332 and 336. Each of the TMAX units 340 and 342 selects the maximum of its two inputs and adds a correction factor to the selected maximum value. As noted above, the correction factor is a function of the two input values and may be implemented as a lookup table. The outputs of TMAX units 340 and 342 are stored in quad register TRsd. The instruction illustrated in FIG. 14 adds the data values contained in quad register Rmq to the respective data values contained in register pairs TRmd and TRnd, selects the maximum of the outputs of two summing units and adds a correction factor to the selected maximum value.

Figure 15:
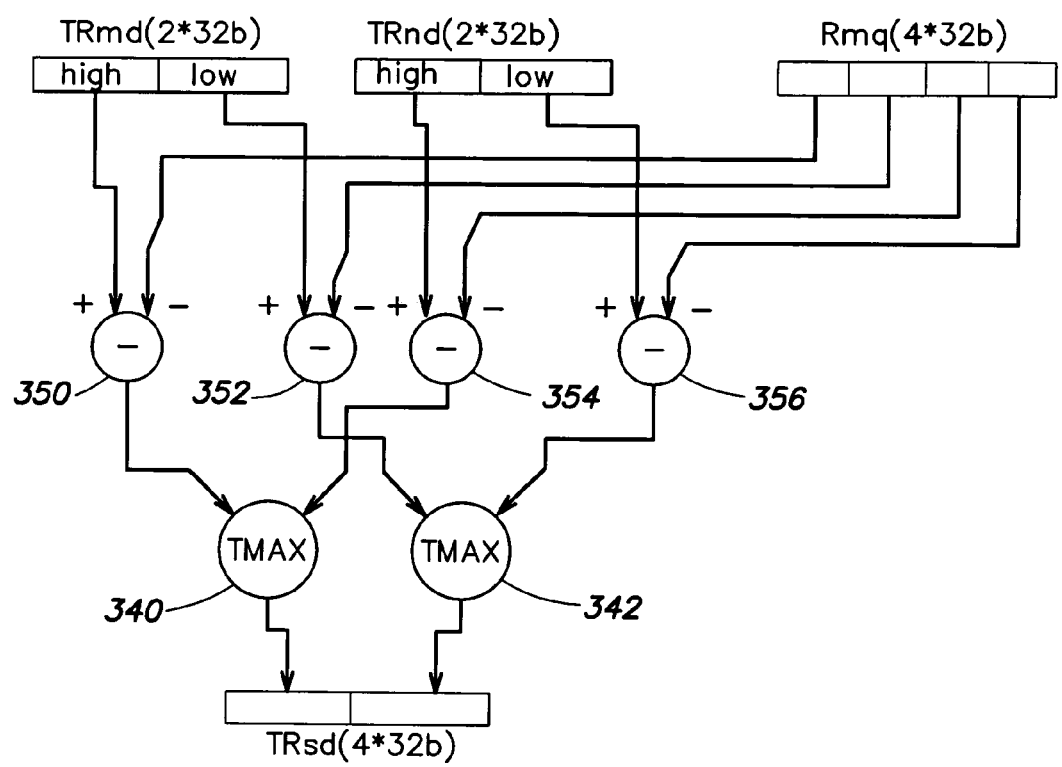
FIG. 15 is a data flow diagram that illustrates operations performed in response to a second log MAP instruction.

A data flow diagram that illustrates operations performed in response to a second type of log MAP instruction is shown in FIG. 15. Like elements in FIGS. 14 and 15 have the same reference numerals. The operations shown in FIG. 15 are similar to those shown in FIG. 14, except that summing units 330, 332, 334 and 336 of FIG. 14 are replaced with subtracting units 350, 352, 354 and 356, respectively. Thus, TMAX unit 340 receives the outputs of subtracting units 350 and 354, and TMAX unit 342 receives the outputs of subtracting units 352 and 356. The instruction illustrated in FIG. 15 subtracts the data values contained in quad register Rmq from the data values contained in register pairs TRmd and TRnd, selects the maximum of the outputs of two subtracting units and adds a correction factor to the selected maximum value.

An example of software code for calculating the log likelihood ratio of a trellis function is shown in FIG. 16. The code is implemented using TMAX instructions, which perform the operations shown in FIGS. 14 and 15 and described above. In FIG. 16, each TMAX instruction specifies calculations for two log MAP calculations as shown in FIG. 14 or FIG. 15. The TMAX instruction is executed in computation blocks 112 and 114 (FIG. 7) to provide a total of four log MAP calculations.

In the first instruction line of FIG. 16, TR1:0 and TR3:2 correspond to register pair TRmd and register pair TRnd, respectively, in FIG. 14. Also in the first instruction line, R9:8 and R11:10 correspond to quad register Rmq in FIG. 14. The data values contained in the specified registers are processed as shown in FIG. 14 or FIG. 15 and described above. It will be understood that the instruction may be executed in both computation units with different data values to perform four log MAP calculations in response to a single TMAX instruction.

Figure 17:
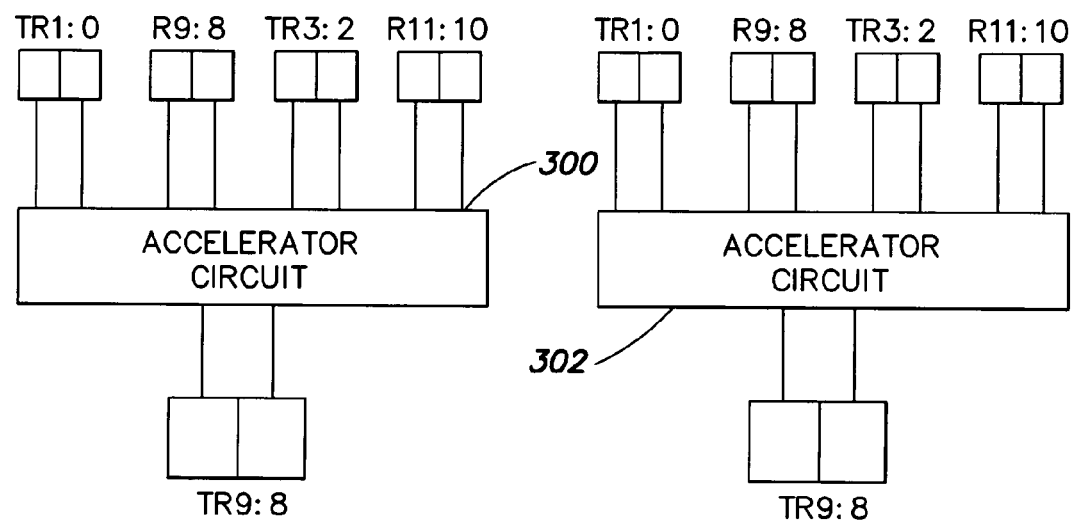
FIG. 17 is a schematic block diagram that illustrates hardware components used for execution of the first instruction line in the software code of FIG. 16.

The execution of the first instruction line in the software code of FIG. 16 is described with reference to FIG. 17. As shown in FIG. 17, accelerator circuit 300 in computation block 112 receives data values from register pairs TR1:0, R9:8, TR3:2 and R11:10, and supplies output data values to register pair TR9:8. Similarly, accelerator circuit 302 in computation block 114 receives data values from register pairs TR1:0, R9:8, TR3:2 and R11:10, and supplies output data values to register pair TR9:8. Each of accelerator circuits 300 and 302 performs the operations shown in FIG. 14 or FIG. 15, as specified by the instruction.

Figure 18:
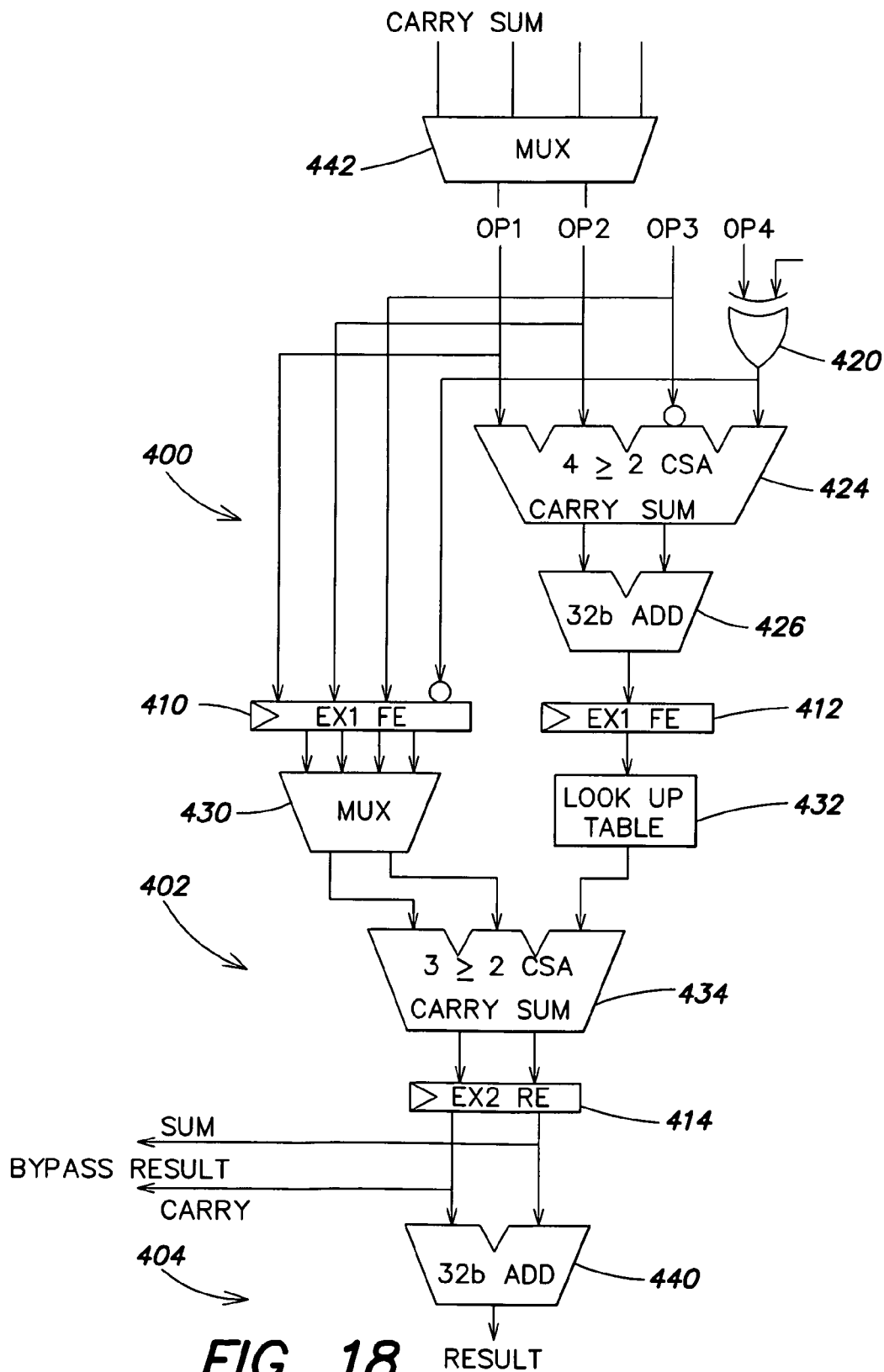
FIG. 18 is a block diagram that illustrates an embodiment of the accelerator of FIG. 8.

An embodiment of each accelerator circuit 300, 302 (FIGS. 12, 13 and 17) is shown in FIG. 18. The accelerator circuit has a pipeline architecture, including a first pipeline stage 400, a second pipeline stage 402 and a third pipeline stage 404. The first and second pipeline stages 400 and 402 are connected through stage registers 410 and 412, and the second and third pipeline stages 402 and 404 are connected through a stage register 414. First stage 400 includes an exclusive OR gate 420, a four input carry save adder 424 and a 32-bit adder 426. Second stage 402 includes a multiplexer 430, a lookup table 432 and a three input carry save adder 434. Third stage 404 includes a 32-bit adder 440. A bypass result output by register 414 is coupled through a multiplexer 442 to inputs OP1 and OP2 to execute instructions in two pipeline phases as described below.

The accelerator circuit shown in FIG. 18 may be used to execute the ACS instruction. With reference to FIG. 9, the ACS instruction performs the following operation.

$$\text{MAX}(TRmd+Rm, TRnd-Rm)+C \qquad (3)$$

where C is the optional correction factor. The MAX operation is equivalent to subtracting the two values in parentheses to obtain:

$$TRmd-TRnd+2Rm \qquad (4)$$

The circuit then determines whether the value of expression (4) is positive or negative. When the value of expression (4) is positive, the first term within parentheses in expression (3) is the maximum value, and when this value is negative, the second term within parentheses in expression (3) is the maximum value.

When an ACS instruction is being executed, the data value in register TRmd is supplied to inputs OP1 and OP2, the data value in register TRnd is supplied to input OP3 and the data value 2Rm is supplied to input OP4. The output of 32-bit adder 426 represents the value of expression (4) above. This value is used to access a correction factor in lookup table 432. The sign of the output of 32-bit adder 426 is used as a control signal for multiplexer 430, thereby selecting TRmd and Rm or TRnd and Rm. The selected values and the output of lookup table 432 are supplied to inputs of carry save adder 434. The output of 32-bit adder 440 represents the selected maximum value plus the correction factor C provided by lookup table 432. In order to reduce the execution time of the ACS instruction to two pipeline cycles, the output of carry save adder 434 may be supplied to inputs OP1 and OP2 of carry save adder 424. When the result of a previous ACS instruction is being used, the carry output of adder 424 is supplied through multiplexer 442 to input OP1 and the sum output of adder 424 is supplied through multiplexer 442 to input OP2. When the input to the accelerator is provided from a register, then the bypass function is not utilized and the register input is supplied through multiplexer 442 to input OP1. In cases where the correction factor is not utilized in the ACS instruction, the output of lookup table 432 is zero.

The accelerator circuit shown in FIG. 18 may be used to execute the TMAX instruction. With reference to FIG. 14, the TMAX instruction performs the following operation.

$$\text{MAX}(TRmd+Rm3, TRnd+Rm1)+C \qquad (5)$$

The MAX operation in expression (5) is equivalent to subtracting the two values as follows.

$$TRmd+Rm3-TRnd-Rm1 \qquad (6)$$

The circuit then determines whether the value of expression (6) is positive or negative. When the value of expression (6) is positive, the first term within parentheses in expression (5) is the maximum, and when the value of expression (6) is negative, the second term within parentheses in expression (5) is the maximum.

Referring again to FIG. 18, for executing the TMAX instruction, the value in register TRmd is supplied to input OP1, the value in register Rm1 is supplied to input OP2, the value in register TRnd is supplied to input OP3 and the value in register Rm2 is supplied to input OP4. In a manner similar to the ACS instruction, the output of 32 bit-adder 426 is used to access lookup table 432 and the sign of the output of adder 426 is used to control multiplexer 430. The multiplexer 430 selects the maximum value and supplies the maximum value to carry save adder 434. The adder 434 adds the selected maximum value and the correction value from lookup table 432 to provide an output result.

While there have been shown and described what are at present considered the preferred embodiments of the present invention, it will be obvious to those skilled in the art that various changes and modifications may be made therein without departing from the scope of the invention as defined by the appended claims.

The invention claimed is:

1. A method for processing signal values comprising:
in response to a single trellis instruction that specifies trellis state metrics for a time $t_0$, based on the signal values, and transition metrics from time $t_0$ to time $t_1$, for selected trellis states, a programmable digital signal processor executing the steps of:
adding a transition metric to a first state metric for time $t_0$ to provide a first value;
subtracting the transition metric from a second state metric for time $t_0$ to provide a second value;
for each selected trellis state, comparing the first and second values; and
selecting the maximum of the first and second values for each selected trellis state to provide trellis state metrics for time $t_1$, wherein the adding, subtracting, comparing and selecting operations are executed in response to the single trellis instruction by a pipelined accelerator including a first carry save adder receiving inputs, a first full adder combining sum and carry outputs of the first carry save adder, a lookup table generating a correction factor in response to the output of the first full adder, a multiplexer selecting one or more of the inputs to the accelerator in response to the sign of the output of the first full adder, a second carry save adder adding one or more outputs of the multiplexer and the output of the lookup table, and a second full adder combining sum and carry outputs of the second carry save adder to provide the trellis state metrics for time $t_1$.

2. A method as defined in claim 1, further comprising the step of, for each selected trellis state, adding to the maximum value a correction factor that is a function of the first and second values.

3. A method as defined in claim 2, wherein the step of adding a correction factor comprises accessing a lookup table containing correction factors.

4. A method as defined in claim 1, wherein the trellis instruction implements a forward trellis function for calculating $\alpha$ trellis state metrics.

5. A method as defined in claim 1, wherein the trellis instruction implements a reverse trellis function for calculating $\beta$ trellis state metrics.

6. A method as defined in claim 1, wherein the trellis instruction simultaneously implements a forward trellis function for calculating $\alpha$ trellis state metrics and a reverse trellis function for calculating $\beta$ trellis state metrics, using a single instruction, multiple data approach.

7. A processor for processing signal values, comprising:
a memory for storing instructions and operands for digital signal computations;
a program sequencer for generating instruction addresses for fetching selected ones of said instructions from said memory; and
a computation block comprising a register file for temporary storage of operands and results and a pipelined accelerator for executing a trellis instruction that specifies trellis state metrics for a time $t_0$ and transition metrics from time $t_0$ to time $t_1$, wherein the trellis state metrics are based on the signal values, said accelerator configured to add a transition metric to a first state metric for time $t_0$ to provide a first value, to subtract the transition metric from a second state metric for time $t_0$ to provide a second value, to determine the maximum of the first and second values for each trellis state and to select the maximum of the first and second values for selected trellis states to provide trellis state metrics for time $t_1$, wherein the pipelined accelerator is configured to execute the adding, subtracting, comparing and selecting operations in response to a single trellis instruction, the pipelined accelerator including a first carry save adder for receiving input; a first full adder for combining sum and carry outputs of the first carry save adder; a lookup table for generating a correction factor in response to the output of the first full adder; a multiplexer for selecting one or more of the inputs to the accelerator in response to the sign of the output of the first full adder; a second carry save adder for adding one or more outputs of the multiplexer and the output of the lookup table; and a second full adder for combining sum and carry outputs of the second carry save adder to provide the trellis state metrics for time $t_1$.

8. A processor as defined in claim 7, wherein the accelerator includes an additional adder to add to the maximum of the first and second values a correction factor that is a function of the first and second values.

9. A processor as defined in claim 8, wherein the accelerator further comprises a lookup table containing correction factors.

* * * * *

UNITED STATES PATENT AND TRADEMARK OFFICE
CERTIFICATE OF CORRECTION

PATENT NO. : 7,661,059 B2  Page 1 of 1
APPLICATION NO. : 09/923225
DATED : February 9, 2010
INVENTOR(S) : Plante et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 905 days.

Signed and Sealed this

Thirtieth Day of November, 2010

David J. Kappos
*Director of the United States Patent and Trademark Office*